US010921859B2

(12) United States Patent
Mahoney et al.

(10) Patent No.: US 10,921,859 B2
(45) Date of Patent: Feb. 16, 2021

(54) COMPOSITE ELECTRONICS CASES AND METHODS OF MAKING AND USING THE SAME

(71) Applicant: SECURAPLANE TECHNOLOGIES, INC., Oro Valley, AZ (US)

(72) Inventors: Brandon Ross Mahoney, Phoenix, AZ (US); Sarajin Ali, Alexandria, VA (US); Dennis Keith Moxley, Dallas, GA (US); Andrew Keith Dickerson, Chulota, FL (US); Thomas David Black, Preston (GB)

(73) Assignee: SECURAPLANE TECHNOLOGIES, INC., Oro Valley, AZ (US)

( * ) Notice: Subject to any disclaimer, the term of this patent is extended or adjusted under 35 U.S.C. 154(b) by 0 days.

(21) Appl. No.: 15/950,124

(22) Filed: Apr. 10, 2018

(65) Prior Publication Data

US 2018/0299928 A1    Oct. 18, 2018

Related U.S. Application Data

(60) Provisional application No. 62/483,880, filed on Apr. 10, 2017.

(51) Int. Cl.
| | |
|---|---|
| *G06F 1/18* | (2006.01) |
| *G06F 1/16* | (2006.01) |
| *H05K 5/02* | (2006.01) |
| *H05K 9/00* | (2006.01) |

(52) U.S. Cl.
CPC ............ *G06F 1/1656* (2013.01); *G06F 1/182* (2013.01); *H05K 5/0204* (2013.01); *H05K 9/009* (2013.01); *H05K 9/0047* (2013.01)

(58) Field of Classification Search
CPC .......... B23P 15/14; F16H 55/17; F16H 57/08; F16H 2055/176
See application file for complete search history.

(56) References Cited

U.S. PATENT DOCUMENTS

| | | | | | |
|---|---|---|---|---|---|
| 4,415,942 | A | * | 11/1983 | Frosch ..................... | G11B 5/62 156/239 |
| 5,269,863 | A | * | 12/1993 | Middelman ............. | B29C 70/16 156/176 |
| 5,290,167 | A | * | 3/1994 | Tanaka .................... | B29C 51/12 156/494 |
| 5,370,921 | A | * | 12/1994 | Cedarleaf ............... | B32B 15/14 428/138 |
| 5,783,278 | A | * | 7/1998 | Nishimura ............. | B29C 70/22 428/102 |

(Continued)

*Primary Examiner* — Rick K Chang
(74) *Attorney, Agent, or Firm* — Hackler Daghighian Martino & Novak

(57) ABSTRACT

A method of making an electronics enclosure that is lightweight, structurally sound and EMI resistant is provided. Preferably the electronics enclosure is made by covering the walls of a mold for the chassis and the lid with a metallic mesh. At least two plies of carbon prepreg are applied over the metallic mesh. The carbon prepreg and metallic mesh are then cured together at high temperature, typically in an autoclave. The wire mesh becomes integrated into the composite material during the curing process when the carbon material shrinks to the mold and the epoxy bonds with the wire mesh. The molds may then be removed leaving an electronics enclosure with superior properties.

20 Claims, 3 Drawing Sheets

(56) References Cited

U.S. PATENT DOCUMENTS

| | | | | |
|---|---|---|---|---|
| 6,238,506 B1* | 5/2001 | Satoh | | B62D 1/04 |
| | | | | 156/169 |
| 6,277,771 B1* | 8/2001 | Nishimura | | B29C 70/22 |
| | | | | 442/229 |
| 7,138,345 B2* | 11/2006 | Wadahara | | B29B 11/16 |
| | | | | 442/179 |
| 8,092,897 B2* | 1/2012 | Honma | | B32B 5/10 |
| | | | | 428/142 |
| 8,304,662 B2* | 11/2012 | Saitou | | H05K 1/0224 |
| | | | | 174/260 |
| 10,287,054 B2* | 5/2019 | Imbrecht | | B65D 19/0018 |
| 2002/0147283 A1* | 10/2002 | Kim | | B29B 11/14 |
| | | | | 525/423 |
| 2003/0034588 A1* | 2/2003 | Miura | | B29C 43/10 |
| | | | | 264/258 |
| 2003/0159777 A1* | 8/2003 | Tsujimoto | | B32B 5/18 |
| | | | | 156/309.6 |
| 2005/0150593 A1* | 7/2005 | Honma | | B32B 5/08 |
| | | | | 156/245 |
| 2008/0182054 A1* | 7/2008 | Ridges | | B29C 70/30 |
| | | | | 428/35.2 |
| 2009/0011262 A1* | 1/2009 | Yoo | | C08G 73/126 |
| | | | | 428/473.5 |
| 2009/0035517 A1* | 2/2009 | Bech | | B29B 11/16 |
| | | | | 428/138 |
| 2009/0227162 A1* | 9/2009 | Kruckenberg | | B64D 45/02 |
| | | | | 442/1 |
| 2010/0136866 A1* | 6/2010 | Kwag | | B29C 43/003 |
| | | | | 442/239 |
| 2010/0151214 A1* | 6/2010 | Cawse | | C08J 5/24 |
| | | | | 428/195.1 |
| 2010/0264266 A1* | 10/2010 | Tsotsis | | B32B 5/26 |
| | | | | 244/117 R |
| 2010/0327737 A1* | 12/2010 | Hayashi | | B64D 47/02 |
| | | | | 313/504 |
| 2011/0143110 A1* | 6/2011 | Tsuchiya | | C08J 5/24 |
| | | | | 428/213 |
| 2012/0288583 A1* | 11/2012 | Segura Moreno | | B29B 11/16 |
| | | | | 425/501 |
| 2012/0305182 A1* | 12/2012 | Azami | | B29C 43/18 |
| | | | | 156/306.6 |
| 2013/0078414 A1* | 3/2013 | Coppens | | B32B 3/22 |
| | | | | 428/77 |
| 2015/0252184 A1* | 9/2015 | Arai | | C08J 5/24 |
| | | | | 523/434 |
| 2016/0214346 A1* | 7/2016 | Hatanaka | | B32B 5/12 |
| 2016/0271901 A1* | 9/2016 | Demange | | B32B 15/14 |
| 2016/0297183 A1* | 10/2016 | Demange | | B32B 27/12 |
| 2017/0028673 A1* | 2/2017 | Tilbrook | | B32B 5/12 |
| 2017/0217127 A1* | 8/2017 | Kobayashi | | B32B 5/24 |
| 2018/0346146 A1* | 12/2018 | Sang | | B64C 1/12 |
| 2019/0030872 A1* | 1/2019 | Bauer | | B32B 27/18 |
| 2019/0210301 A1* | 7/2019 | Naito | | B29C 70/14 |
| 2019/0224890 A1* | 7/2019 | Iwano | | B29C 69/004 |

* cited by examiner

| | AL016 | AL028 | AL060 | CU015 | CU022 | CU029 | CU040 |
|---|---|---|---|---|---|---|---|
| Base Material | Aluminum | Aluminum | Aluminum | Copper | Copper | Copper | Copper |
| Purity | 1145 | 1145 | 1145 | ETP110 | ETP110 | ETP110 | ETP110 |
| Weight (lb./sq.ft.) | 0.016*** | 0.028*** | 0.060*** | 0.015*** | 0.022*** | 0.029*** | 0.040*** |
| Grams/Meter² | 78 | 136 | 293 | 73 | 107 | 141 | 195 |
| Width (inches) | 36 | 36 | 36 | 36 | 36 | 36 | 36 |
| Thickness (inches) | 0.006** | 0.006** | 0.010** | 0.004** | 0.005** | 0.005** | 0.005** |
| Major Pitch (inches) | 0.065* | 0.056* | 0.046* | 0.065* | 0.109* | 0.108* | 0.065* |
| Minor Pitch (inches) | 0.038* | 0.028* | 0.023* | 0.041* | 0.073* | 0.072* | .038 |
| Percent Open Area (%) | 78 | 62 | 49 | 89 | 88 | 84 | 78 |

FIG. 3

COMPOSITE ELECTRONICS CASES AND METHODS OF MAKING AND USING THE SAME

FIELD

The present patent document relates generally to electronics cases. More specifically, the present patent document relates to electronics cases constructed from composite materials and metallic mesh.

BACKGROUND

To date, aviation electronics, and especially large format batteries and high-power conversion electronics, are housed in aluminum chassis. When designed correctly, the aluminum chassis provides structural integrity for the heavy internal parts as well as electromagnetic interference (EMI) suppression. The chassis also can provide bonding for the internal cells and/or electronics and flammability protection.

Reduced weight with equal performance is always a benefit to the aircraft operator. Accordingly, it would be desirable to have an electronics chassis with a reduced weight while providing equal or improved performance with respect to EMI suppression, structural integrity and flammability performance.

SUMMARY OF THE EMBODIMENTS

Objects of the present patent document are to provide improved chassis for housing electronics. In particular, objects of the present invention include providing an electronics chassis/housing with a reduced weight but comparable or improved performance regarding EMI, structural integrity and flammability performance.

To these ends, a method of making an electronics enclosure is provided. In preferred embodiments, the method comprises: covering the walls of a mold for an electronics enclosure chassis with a metallic mesh. Next a similar process is carried out for the lid by covering the walls of a mold for an electronics enclosure lid with the metallic mesh. At least two plies of carbon prepreg are applied over the metallic mesh on the walls of the electronics enclosure chassis mold and the electronics enclosure chassis lid mold. The metallic mesh and carbon prepreg on both the electronics enclosure chassis mold and the electronics enclosure lid mold are then cured at high temperature and allowed to cool such that the epoxy from the carbon prepreg bonds the metallic mesh to the carbon fabric in the carbon prepreg. Finally, the electronics enclosure chassis mold and electronics enclosure lid mold are removed to create an electronics enclosure chassis and an electronics enclosure lid.

In preferred embodiments, the metallic mesh is made from copper. In even more preferred embodiments, the metallic mesh is 80% or more open space. Still more preferably, the metallic mesh has a rhombus grid design with about a 0.108 inch major pitch and about a 0.072 inch minor pitch.

The plies of composite material are preferably applied with their fibers running in different directions. In embodiments using only two plies, the two plies are applied with a 0 degree and a 90 degrees orientation with respect to each other.

In other embodiments, more plies of composite material may be used. In some embodiments, up to six plies of composite material are used. In such embodiments, the at least six plies may be oriented as follows: Ply 1—0 degrees; Ply 2—90 degrees; Ply 3—45 degrees; Ply 4—45 degrees; Ply 5—90 degrees; and Ply 6—0 degrees.

In order to connect the electronic enclosure chassis to the lid, stainless-steel fasteners may be installed around the rim of the lid and a reciprocal stainless-steel fastener around the rim of the chassis.

In yet other embodiments, metallic tape may be used to seal any gaps between the lid and the chassis. The metallic tape may also be used to reinforce areas around any fasteners.

In another embodiment, an electronics enclosure is provided. The electronics enclosure may be used for any application but is especially useful in avionics where weight is a concern. In a preferred embodiment, the electronics enclosure comprises: a chassis made from a composite material and a metallic mesh wherein each wall of the chassis is comprised by a metallic mesh on the inner most layer of the wall and at least two layers of composite material as the outermost layers of the wall and wherein the metallic mesh is permanently bonded to the composite material via a cured resin epoxy; a lid made from a composite material and a metallic mesh wherein each wall of the lid is comprised by a metallic mesh on the inner most layer of the wall and at least two layers of composite material as the outermost layers of the wall and wherein the metallic mesh is permanently bonded to the composite material via a cured resin epoxy; and a plurality of fasteners coupled to the chassis and lid and designed to selectively couple the chassis to the lid.

The description above is just a summary of a few possible embodiments and a more detailed understanding may be obtained from the detailed description that follows along with reference to the drawings.

BRIEF DESCRIPTION OF THE DRAWING

FIG. 3 illustrates a table of potential wire mesh products with their respective specifications.

DETAILED DESCRIPTION OF THE PREFERRED EMBODIMENTS

The embodiments described herein detail light weight composite chassis with an interwoven metallic mesh. In preferred embodiments, composite electronic chassis result in a 50% or more reduction in weight when compared to the typical aluminum electronics chassis. In addition, the composite chassis provide equal or improved performance with respect to EMI suppression, structural integrity and flammability performance.

The embodiments described herein include the strategic embedding of a metallic mesh, preferably a copper mesh, into a composite material chassis. The chassis may be designed specifically for applications where reduced weight is paramount, for example, housing electronics on an aircraft. The amalgamation of the two materials contributes to the effective structural integrity, electromagnetic performance, and flammability performance of the electronics enclosure. The composite chassis can represent a significant weight reduction compared to existing aluminum enclosures and in at least one embodiment, a 54% or more weight reduction from the existing aluminum enclosures is achieved.

The embodiments disclosed and described herein may be used with any type of electronics but may be particularly useful with power equipment such as batteries and their power conversion electronics. In particular, the embodiments described herein may be used with lithium batteries and their accompanying power electronics. The embodiments may also be used in various environments, either in flight applications, space applications, or ground applications.

Figure 1:
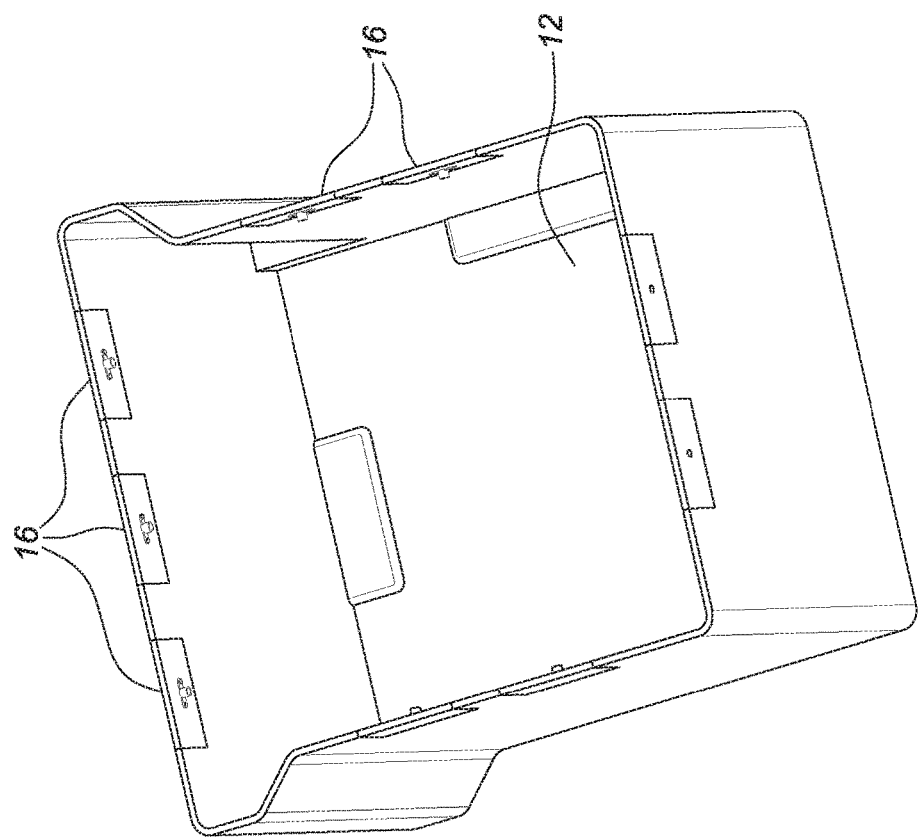
FIG. 1 illustrates an isometric view of an electronics enclosure 10 made from a composite material.
Figure 1:
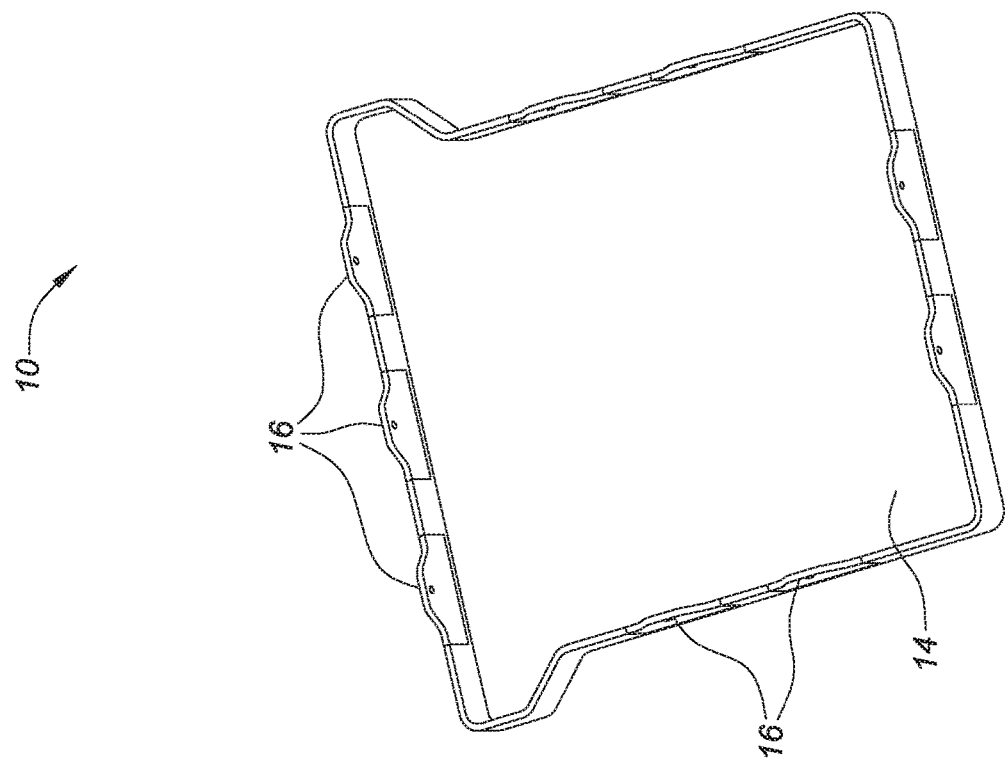

FIG. 1 illustrates an isometric view of an electronics enclosure 10 made from a composite material. As may be seen in FIG. 1, in some embodiments, the electronics enclosure may be made as a two-piece construction. In the embodiment shown in FIG. 1, the electronic enclosure 10 comprises a base or chassis 12 and a lid 14.

The base 12 and the lid 14 are selectively detachable and are secured together with fasteners 16. In the embodiment shown, the fasteners are located around the edge of the lid 14 and in a corresponding location around the top edge of the base 12. In the embodiment shown in FIG. 1, stainless-steel rivets and fasteners are installed to connect the lid 14 and the base 12 of the enclosure. The choice of stainless steel is specifically chosen due to its low risk of galvanic corrosion at the composite material/metal interface. However, in other embodiments, other types of fasteners may be used along with fasteners made from other types of metals or materials.

In the embodiment shown in FIG. 1, the electronics housing 10 is square, however, in other embodiments, the electronics housing 10 may be any shape, for example, the electronics housing 10 may be rectangle, hexagon, octagon or some other custom shape.

In the embodiment shown in FIG. 1, the base 12 and lid 14 of the housing 10 are made from a composite material integrated with a metallic mesh. The metallic mesh is added to the composite to increase the EMI suppression ability of the housing 10.

The preferred composite material is a carbon fabric that has been pre-impregnated with a resin system, commonly referred to as "carbon prepreg." This composite's lighter weight and increased strength present ideal properties for operating in extreme environments. Other possible composites that may be used include, but are not limited to Fiberglass, Kevlar and other carbon configurations. The wall thickness of the enclosure is driven by the structural requirements of the specific application. The typical thickness is four plies of composite material, resulting in an approximate 0.03" thickness. Although, acceptable ranges of composite thickness may vary from two (0.015") to six (0.045") plies in different applications.

In order to build the enclosure 10, the metallic mesh is laid onto a molding tool and the plies of composite laid atop the mesh. The fiber orientation in which the plies of composite are laid is dependent on the application's structural requirements. Table 1 provides a ply orientation for a preferred embodiment. Directional weaves of 0°, 45°, and 90° are used in this embodiment to optimize the structural rigidity so that the chassis 10 may survive under extreme stresses and vibration. However, as one skilled in the art will appreciate, the chassis 10 design is not limited to the orientation pattern shown in Table 1. In other embodiments more or less plies may be used and they may be laid in different orientations depending on the structural requirements.

TABLE 1

Ply Orientation

| Layer Number | Orientation |
| --- | --- |
| 1 | 0° |
| 2 | 90° |
| 3 | 45° |
| 4 | 45° |
| 5 | 90° |
| 6 | 0° |

Once the metallic mesh and the composite plies have been laid over a mold, the entire assembly is cured at high temperature. An autoclave may be used to cure the assembly. The mesh is bonded to the composite material during the exposure to elevated temperatures and pressures in the autoclave during the curing process. In this process, the epoxy in the composite prepreg bonds with the metallic mesh and the two are joined together as they are removed from the heat and relax around the mold tool.

Figure 2:
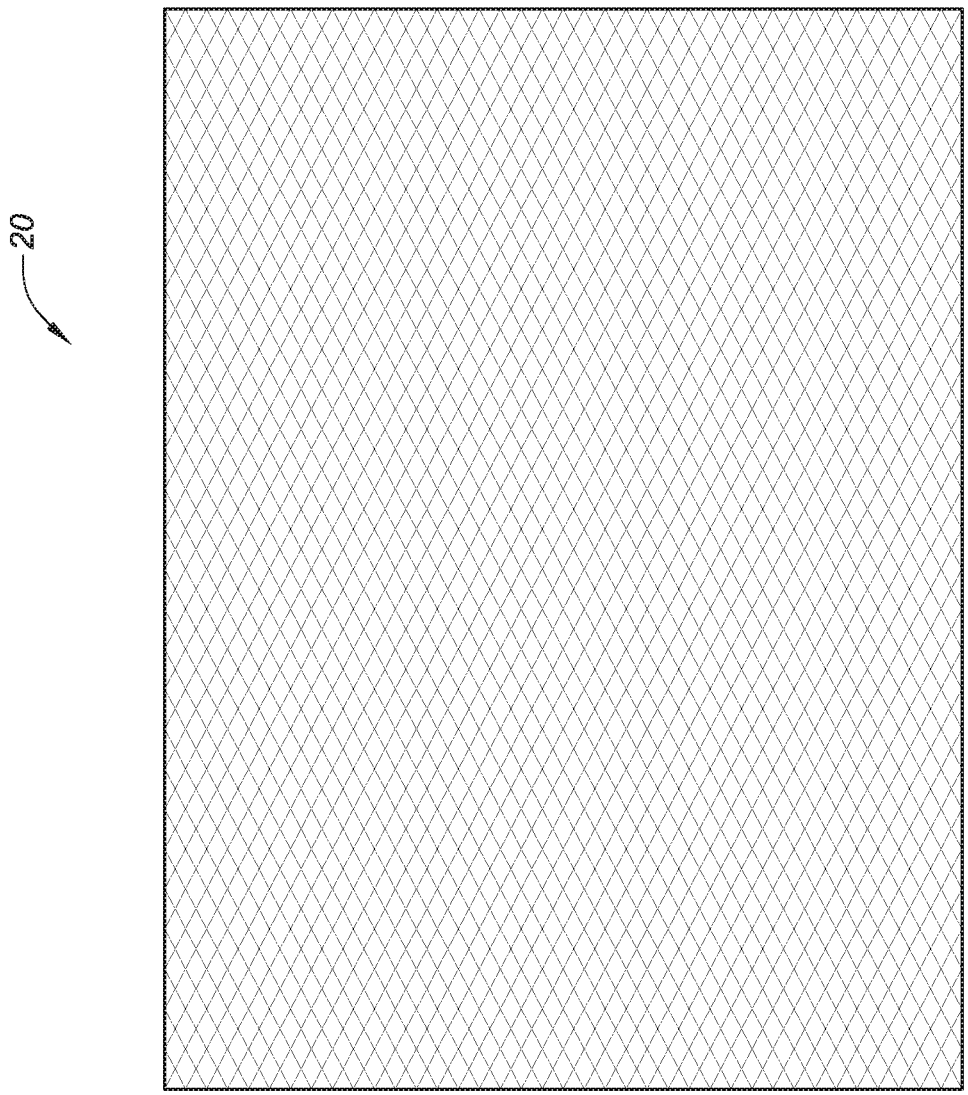
FIG. 2 illustrates a top down view of a metallic mesh 20.

FIG. 2 illustrates one embodiment of a metallic mesh 20 that may be used in the construction of electronic enclosures 10. The copper mesh grid shown in FIG. 2 has a rhombus spacing distribution. In the embodiment shown in FIG. 2, the spacing distribution has a 0.108" major pitch, and a 0.072 inch minor pitch. This spacing allows 84% of the grid to be open area. This coarse spacing allows less copper to be used (thus, decreasing weight) while still effectively utilizing the copper's protective EMI characteristics. Accordingly, in preferred embodiments, a metallic mesh may be used with about a 0.108" major pitch and about a 0.072" minor pitch. The major pitch and minor pitch may vary slightly assuming the overall open space of the metallic mesh is maintained.

Although the copper mesh illustrated in FIG. 2 has been found to have preferable properties, other mesh designs may be used. Other mesh shapes such as hexagon or octagon or triangle may be used. In some embodiments that require a three-dimensional mesh, combinations of shapes may be used such as in a truncated icosahedron.

Other mesh fill densities may be used to achieve different levels of strength and EMI suppression versus weight. In preferred embodiments, the metallic mesh has between 80% and 85% open area. In yet other embodiments, the metallic mesh has between 70% and 90% open area. In still yet other embodiments, the metallic mesh may have between 50% and 90% open area. Preferably, the metallic mesh has at least 80% open area.

The mesh grid is applied to all internal surfaces of the chassis 12 and lid 14. In preferred embodiments, the copper used in the mesh has a purity rating of ETP110 and has 0.02% to 0.04% oxygen content.

FIG. 3 illustrates a table of a number of metallic meshes that may be used. In preferred embodiments, the metallic mesh labelled CU029 may be used. The metallic mesh listed in FIG. 3 are currently available from Astrostrike® but metallic mesh with similar properties from any vendor may be used.

In operation, electromagnetic interference (EMI) generated by internal electronics within the enclosure is attenuated by the metallic mesh structure embedded in the composite material. In addition, conductive tape is placed at the interface of the lid and the chassis to further improve electromagnetic shielding strength. The attenuation of this energy restrains radio waves from disrupting aircraft functions during normal operation. Results from electromagnetic radiated emissions testing show that the copper-embedded, composite chassis demonstrates the same average attenuation as its existing aluminum chassis counterpart.

Further, the embedded copper inhibits any existing flame from spreading or growing through the walls of the composite chassis. Samples of the copper mesh/composite combination were flammability tested in accordance with RTCA DO-160G Section 26.6.2. All samples incorporating the copper mesh passed by a significant margin. The conductivity and low oxygen content of the copper allow heat from an intruding flame to be dispersed throughout the grid, preventing the growth of the flame. The implementation of the copper mesh provides a sufficient defense against flammability and eliminates the need for additional flame-retardant coatings and operations to be applied, thus avoiding the introduction of more weight to the chassis.

In the transition to the lightweight carbon composite chassis, the structural integrity of the enclosure is not compromised. Comprehensive vibrational analysis was performed incorporating the representative materials and build of the chassis. The analysis yielded results that concluded the composite chassis to be capable of withstanding vibration in accordance with DO-160G standards in the same way an equivalent aluminum chassis would.

Although the specification has explained the embodiments with reference to specific figures and examples, those descriptions are provided for example only and should not limit the full scope of the embodiments as claimed below.

What is claimed is:

1. A method of making an electronics enclosure comprising:
    covering walls of an electronics enclosure chassis mold with metallic mesh;
    covering walls of an electronics enclosure lid mold with metallic mesh;
    applying at least two plies of carbon prepreg over the metallic mesh on the walls of the electronics enclosure chassis mold;
    applying at least two plies of carbon prepreg over the metallic mesh on the walls of the electronics enclosure chassis lid mold;
    curing the metallic mesh and the carbon prepreg on both the electronics enclosure chassis mold and the electronics enclosure lid mold at high temperature and allowing the metallic mesh and carbon prepreg on both the electronics enclosure chassis mold and the electronics enclosure lid mold to cool such that epoxy from the carbon prepreg bonds the metallic mesh to carbon fabric in the carbon prepreg; and
    removing the electronics enclosure chassis mold and electronics enclosure lid mold to create a chassis and a lid.

2. The method of claim 1, wherein the metallic mesh of both the covering walls of an electronics enclosure step and covering walls of an electronics enclosure lid step is made from copper.

3. The method of claim 2, wherein the metallic mesh is 80% or more open space.

4. The method of claim 3, wherein the metallic mesh has a rhombus grid design.

5. The method of claim 4, wherein the metallic mesh has about a 0.108 inch major pitch and about a 0.072 inch minor pitch.

6. The method of claim 1, wherein the at least two plies of carbon prepreg on the electronics enclosure lid mold and the electronics enclosure chassis mold are applied in a 0 degrees and a 90 degrees orientation with respect to each other.

7. The method of claim 1, wherein at least six plies of carbon prepreg are applied to both the electronics enclosure chassis mold and the electronics enclosure chassis lid.

8. The method of claim 7, wherein the at least six plies are oriented as follows: Ply 1—0 degrees; Ply 2—90 degrees; Ply 3—45 degrees; Ply 4—45 degrees; Ply 5—90 degrees; and Ply 6—0 degrees.

9. The method of claim 1, further comprising installing stainless-steel fasteners around a rim of the lid and a reciprocal stainless-steel fastener around a rim of the chassis.

10. The method of claim 9, further comprising the step of securing the lid to the chassis using a metallic tape.

11. The method of claim 9, wherein the stainless-steel fasteners are rivets.

12. The method of claim 9, wherein an area around each stainless-steel fastener is reinforced with metallic tape.

13. A method of making an electronics enclosure comprising:
    covering walls of an electronics enclosure chassis mold with copper mesh that has 80% or more open space;
    covering walls of an electronics enclosure lid mold with copper mesh that has 80% more open space;
    applying at least two plies of carbon prepreg over the copper mesh on the walls of the electronics enclosure chassis mold;
    applying at least two plies of carbon prepreg over the copper mesh on the walls of the electronics enclosure chassis lid;
    curing the copper mesh and the carbon prepreg on both the electronics enclosure chassis mold and the electronics enclosure lid mold at high temperature and allowing the copper mesh and carbon prepreg on both the electronics enclosure chassis mold and the electronics enclosure lid mold to cool such that epoxy from the carbon prepreg bonds the copper mesh to carbon fabric in the carbon prepreg; and
    removing the electronics enclosure chassis mold and electronics enclosure lid mold.

14. The method of claim 13, wherein the copper mesh of both the covering walls of an electronics enclosure step and covering walls of an electronics enclosure lid step has a rhombus grid design.

15. The method of claim 14, wherein the copper mesh has about a 0.108 inch major pitch and about a 0.072 inch minor pitch.

16. The method of claim 13, wherein the at least two plies of carbon prepreg on the electronics enclosure lid mold and the electronics enclosure chassis mold are applied in a 0 degrees and a 90 degrees orientation with respect to each other.

17. The method of claim 13, wherein at least six plies of carbon prepreg are applied to both the electronics enclosure chassis mold and the electronics enclosure chassis lid mold.

18. The method of claim 17, wherein the at least six plies are oriented as follows: Ply 1—0 degrees; Ply 2—90 degrees; Ply 3—45 degrees; Ply 4—45 degrees; Ply 5—90 degrees; and Ply 6—0 degrees.

19. The method of claim 13, further comprising installing stainless-steel fasteners around a rim of the lid and a reciprocal stainless-steel fastener around a rim of the chassis.

20. The method of claim 19, further comprising the step of securing the lid to the chassis using a metallic tape.

* * * * *